United States Patent
Tamaki

(10) Patent No.: US 7,589,755 B2
(45) Date of Patent: Sep. 15, 2009

(54) APPARATUS AND METHOD FOR RECORDING IMAGE ON PHOTOSENSITIVE MATERIAL

(75) Inventor: Eiichi Tamaki, Kyoto (JP)

(73) Assignee: Dainippon Screen Mfg. Co., Ltd., Kyoto (JP)

(*) Notice: Subject to any disclaimer, the term of this patent is extended or adjusted under 35 U.S.C. 154(b) by 166 days.

(21) Appl. No.: 11/544,745

(22) Filed: Oct. 10, 2006

(65) Prior Publication Data

US 2007/0097387 A1    May 3, 2007

(30) Foreign Application Priority Data

Oct. 31, 2005    (JP)    ............... P2005-316731

(51) Int. Cl.
    *B41J 2/47*    (2006.01)
(52) U.S. Cl. ................... 347/239; 347/255
(58) Field of Classification Search ............ 347/239, 347/255, 240, 251; 359/290, 566, 204.5, 359/211.6, 337.21, 563, 573
    See application file for complete search history.

(56) References Cited

U.S. PATENT DOCUMENTS

| 4,879,605 | A | 11/1989 | Warkentin et al. | |
|---|---|---|---|---|
| 6,229,650 | B1 * | 5/2001 | Reznichenko et al. | 359/566 |
| 6,728,023 | B1 * | 4/2004 | Alioshin et al. | 359/290 |
| 6,822,670 | B2 * | 11/2004 | Hirawa | 347/239 |
| 7,050,081 | B2 * | 5/2006 | Tamaki | 347/239 |
| 7,212,225 | B2 * | 5/2007 | Sumi et al. | 347/239 |
| 2004/0036950 | A1 | 2/2004 | Hunter et al. | |
| 2006/0033806 | A1 * | 2/2006 | Nakagawa | 347/239 |

FOREIGN PATENT DOCUMENTS

JP    3530157    3/2004

OTHER PUBLICATIONS

Rieger, et al., "Image quality enhancements for raster scan lithography," SPIE Optical/Laser Microlithography, 1988, pp. 55-64, vol. 922.

Corrigan, et al., "Grating Light Valve™ Technology for Projection Displays," International Display Workshop, Dec. 9, 1998, Paper No. LAD5-1, Kobe, Japan.

* cited by examiner

*Primary Examiner*—Hai C Pham
(74) *Attorney, Agent, or Firm*—McDermott Will & Emery LLP

(57) ABSTRACT

A spatial light modulator has a plurality of grating elements. Each grating element can be switched between a diffracting state and a reflecting state, and only zeroth order light beams from the spatial light modulator are directed onto photosensitive material. An irradiation position on the photosensitive material is moved in a direction perpendicular to a width direction corresponding to an arrangement direction of the grating elements. The minimum line width on the photosensitive material corresponds to a width of a predetermined number of grating elements where the predetermined number is two or more. Each group of grating elements which are spatially continuously in the diffracting state or spatially continuously in the reflecting state consists of the predetermined number of grating elements or more while writing is performed. This makes it possible to appropriately record an image on the photosensitive material at high addressable resolution.

2 Claims, 9 Drawing Sheets

APPARATUS AND METHOD FOR RECORDING IMAGE ON PHOTOSENSITIVE MATERIAL

BACKGROUND OF THE INVENTION

1. Field of the Invention

The present invention relates to a technique for recording an image on a photosensitive material by irradiation with light.

2. Description of the Background Art

Developed has been a spatial light modulator of diffraction grating type which is capable of changing the depth of grating by alternately forming fixed ribbons and moving ribbons on a substrate with a semiconductor device manufacturing technique and deflecting the moving ribbons relatively to the fixed ribbons (that is to say, moving the reflective surfaces of the moving ribbons). It is proposed that such a spatial light modulator is used in various fields such as CTP (Computer to Plate) as a high-speed switching element of light over a wide range of wavelength, since the intensities of regular reflection light and diffracted light are changed by changing the depth of grooves on the spatial light modulator as above.

For example, in an image recording apparatus disclosed in Japanese Patent Publication No. 3530157 (Document 1), a spatial light modulator of diffraction grating type is irradiated with light, and then reflected light beams (zeroth order light beams) from portions in a state where the fixed ribbons and the moving ribbons are positioned at the same height from a base surface on the spatial light modulator are guided to a photosensitive material and non-zeroth order diffracted light beams (mainly first order diffracted light beams) from portions in a state where the moving ribbons are deflected are blocked, to achieve an image recording on the photosensitive material.

U.S. Pat. No. 4,879,605 (Document 2) and "Image quality enhancements for raster scan lithography" (Document 3) (Michael L. Rieger et al., SPIE vol. 922, Optical/Laser Microlithography, pp. 55-64, 1988) disclose a method where respective irradiation regions are set with their centers lying at positions on a photosensitive material and partially overlapping with adjacent irradiation regions, and writing is performed by irradiation with light onto each irradiation region. In the method, an amount of light applied onto each of specified irradiation regions is varied to make a variable unit of edge position of photosensed area on the photosensitive material (hereat, the photosensed area is an area where a part of photosensitive material is changed in nature) smaller than the center-to-center distance between two adjacent irradiation regions (that is to say, addressable resolution (positional resolution) goes up).

In a spatial light modulator for a general image recording apparatus, out of a plurality of ribbon pairs each of which is a combination of one fixed ribbon and one moving ribbon, continuous six ribbon pairs are determined as a unit of modulation control (see Document 1, for example) and United States Patent Application Publication Ser. No. 2004/0036950 discloses a spatial light modulator of diffraction grating type for independently controlling each of the plurality of ribbon pairs (where one ribbon pair is determined as a unit of modulation control). In a general display with the spatial light modulator of diffraction grating type, continuous three ribbon pairs out of the plurality of ribbon pairs are a unit of modulation control.

In the method of Document 2 and 3, normally, the rate of change of accumulated light amount of irradiation light decreases in the vicinity of edge position of the photosensed area on the photosensed material (i.e., the boundary blurs) and the edge position of actual photosensed area (or line width) on the photosensitive material greatly changes, even if the light amount for photosensing of the photosensitive material slightly varies depending on various conditions for image recording such as environment conditions. This problem particularly arises in a photosensitive material with small gamma value.

SUMMARY OF THE INVENTION

The present invention is intended for an apparatus for recording an image on a photosensitive material by irradiation with light. It is an object of the present invention to appropriately record an image on a photosensitive material at high addressable resolution.

The apparatus comprises a light source emitting light; a spatial light modulator of diffraction grating type, having a plurality of grating elements each extending in a direction perpendicular to a predetermined arrangement direction, the plurality of grating elements being arranged in the arrangement direction; an optical system for directing either zeroth order light beams or (+/-) first order diffracted light beams from the spatial light modulator irradiated with light by the light source, onto a photosensitive material; a scanning mechanism for moving an irradiation position on the photosensitive material of light from the spatial light modulator in a scan direction perpendicular to a width direction corresponding to the arrangement direction; and a writing controller for switching each of the plurality of grating elements between a diffracting state and a reflecting state in synchronization with movement of the irradiation position, and in the apparatus, a minimum line width to be written on the photosensitive material corresponds to a width of a predetermined number of grating elements where the predetermined number is two or more, each group of grating elements which are spatially continuously in the diffracting state or spatially continuously in the reflecting state consists of the predetermined number of grating elements or more while writing is performed, and a moving distance of the irradiation position on the photosensitive material between a switching of state in each grating element and a subsequent switching of state is equal to or larger than the minimum line width and the moving distance is an integral multiple of a distance equal to or smaller than the minimum line width.

According to the present invention, in an image recording with the spatial light modulator of diffraction grating type, it is possible to appropriately record an image on the photosensitive material at a line width equal to or greater than the minimum line width with an addressable resolution in the width direction which is a distance on the photosensitive material corresponding to a width of the grating element.

According to a preferred embodiment of the present invention, in the grating elements, one grating element comprises only one set of a strip-like fixed reflective surface and a strip-like moving reflective surface which extend in a direction perpendicular to the arrangement direction. More preferably, the predetermined number is three or more.

According to another preferred embodiment of the present invention, the moving distance of the irradiation position on the photosensitive material between a switching of state in each grating element and a subsequent switching of state is an integral multiple of a length obtained by dividing the minimum line width by the predetermined number. This makes it possible to record an image on the photosensitive material at the same addressable resolution with respect to the scan direction and the width direction.

According to still another preferred embodiment of the present invention, information representing inexistence of switching or a time of switching between the diffracting state and the reflecting state of each grating element which is performed while the irradiation position is moved by a distance equal to the minimum line width is inputted from the writing controller to a driving circuit of the spatial light modulator every time when the irradiation position is moved by a distance of the minimum line width. This makes it possible to make an output cycle of signal from the writing controller to the driving circuit of the spatial light modulator longer. The present invention is also intended for a method for recording an image on a photosensitive material by irradiation with light.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
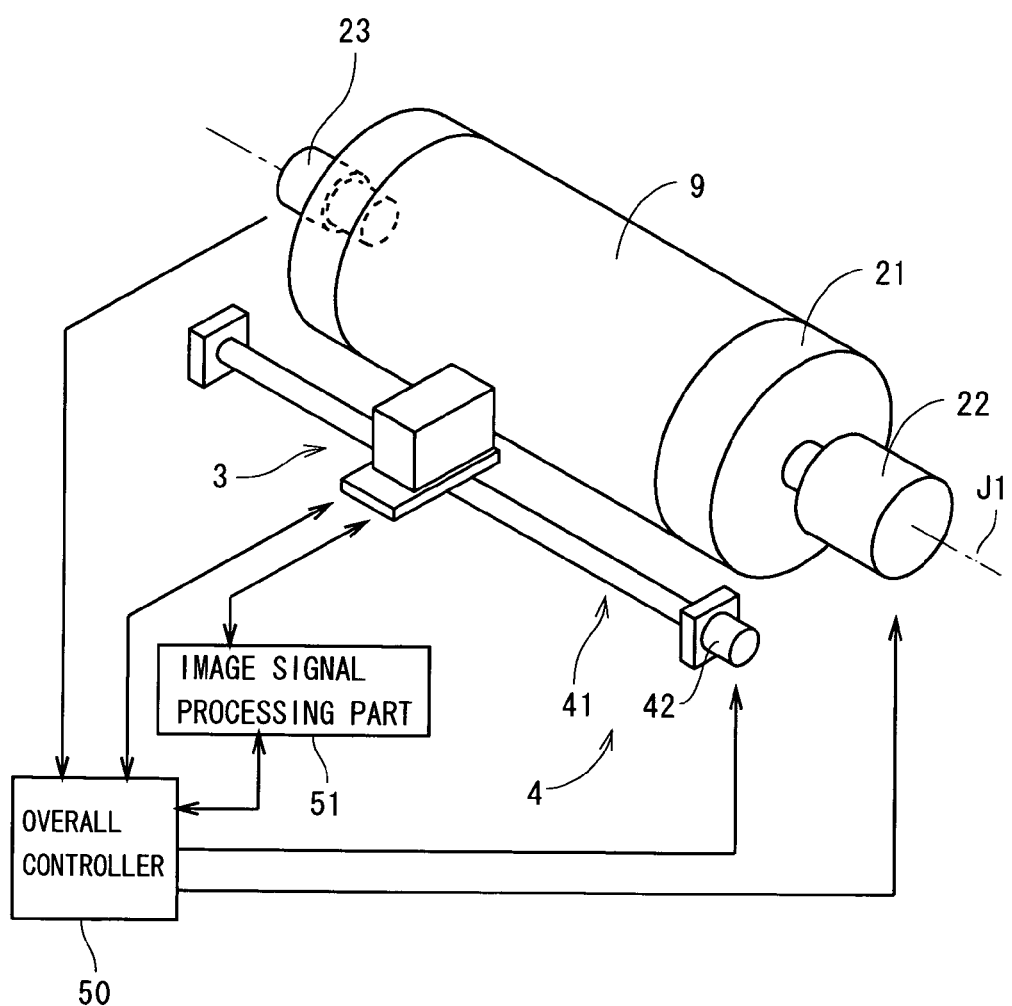
FIG. 1 is a view showing a constitution of an image recording apparatus in accordance with a first preferred embodiment.

FIG. 1 is a view showing a constitution of an image recording apparatus 1 in accordance with the first preferred embodiment of the present invention. The image recording apparatus 1 comprises a holding drum 21 for holding a photosensitive material 9 on its cylindrical outer surface around a predetermined rotation axis J1, a drum rotation mechanism 22 with a motor and a reducer, a head part 3 emitting light toward the photosensitive material 9, and a head moving mechanism 4 for moving the head part 3 in a direction parallel to the rotation axis J1. The image recording apparatus 1 is a so-called external drum type platesetter.

In the image recording apparatus 1 of FIG. 1, the drum rotation mechanism 22 rotates the holding drum 21 around the rotation axis J1 at a constant speed and an irradiation position on the photosensitive material 9 of light from the head part 3 is moved in a scan direction relatively to the photosensitive material 9 (i.e., the drum rotation mechanism 22 functions as a scanning mechanism). The head moving mechanism 4 has a ball screw mechanism 41 and a motor 42, and the motor 42 rotates to move the head part 3 in a direction along the rotation axis J1 relatively to the holding drum 21 and then the irradiation position of light is moved on the photosensitive material 9 in a width direction parallel to the rotation axis J1 and perpendicular to the scan direction. In other words, the irradiation position of light is fixed with respect to the head part 3, and with rotation of the holding drum 21 and movement of the head part 3, the irradiation position is moved relatively to the photosensitive material 9.

The image recording apparatus 1 further comprises an image signal processing part 51 for converting an original image which is to be written into an image for writing in the head part 3 and an overall controller 50 connected to a drum rotation mechanism 22, a (rotary) encoder 23 for detecting a rotational position of the drum rotation mechanism 22, the head part 3, the head moving mechanism 4, and the image signal processing part 51. The overall controller 50 controls each constituent element and light is applied onto the photosensitive material 9, to record an image on the photosensitive material 9.

Figure 2:
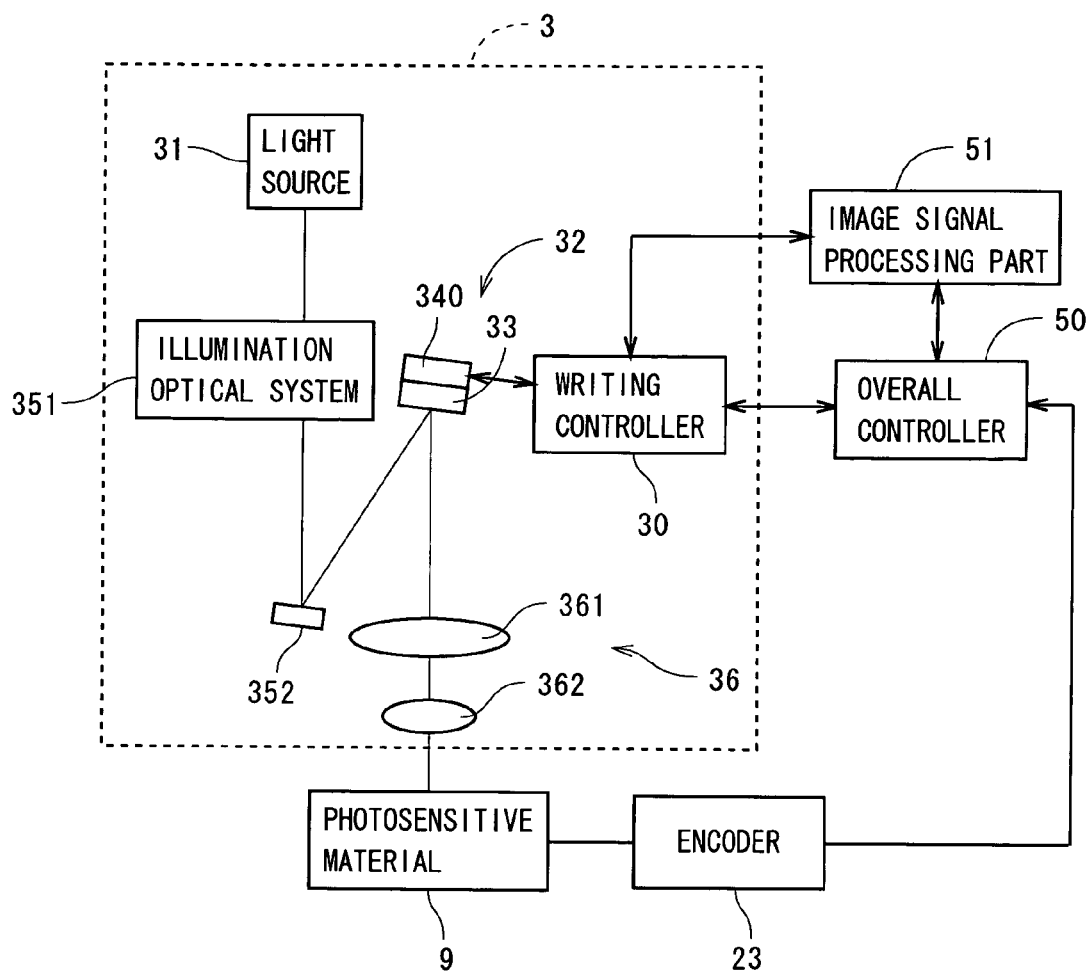
FIG. 2 is a view showing an internal constitution of a head part.

FIG. 2 is a view showing an internal constitution of the head part 3, and constituent elements in the head part 3 are surrounded by a broken-line rectangle 3 in FIG. 2. The head part 3 shown in FIG. 2 comprises a light source 31 emitting light with a wavelength ranging from, e.g., 800 to 830 nanometer (nm), a light modulation unit 32 having a spatial light modulator 33 of diffraction grating type, and a writing controller 30 connected to the image signal processing part 51 and the overall controller 50, for controlling modulation of the light modulation unit 32. For example, the light source 31 is a continuously oscillating near-infrared semiconductor laser and as the spatial light modulator of diffraction grating type, for example, the GLV (Grating Light Valve) (a trademark of Sillicon Light Machine, San Jose, Calif.) is well known.

Light from the light source 31 is directed onto the spatial light modulator 33 of the light modulation unit 32 through an illumination optical system 351 and a mirror 352. In this case, the light from the light source 31 becomes linear light with a uniform distribution of intensities (light having a linear section of luminous flux) through the illumination optical system 351, and applied onto an effective area for modulation operation on the spatial light modulator 33. In the spatial light modulator 33, a part of light from the mirror 352 is reflected to a zoom lens 361 on the basis of control of the writing controller 30 and directed onto the photosensitive material 9 through a focusing lens 362 at a predetermined magnification. In other words, in the head part 3, the zoom lens 361 and the focusing lens 362 constitute a projection optical system 36 for directing light modulated in the spatial light modulator 33 onto the photosensitive material 9. The projection optical system 36 does not necessarily have to be constituted of the zoom lens 361 and the focusing lens 362 but other optical element may be additionally provided or the like.

Figure 3:
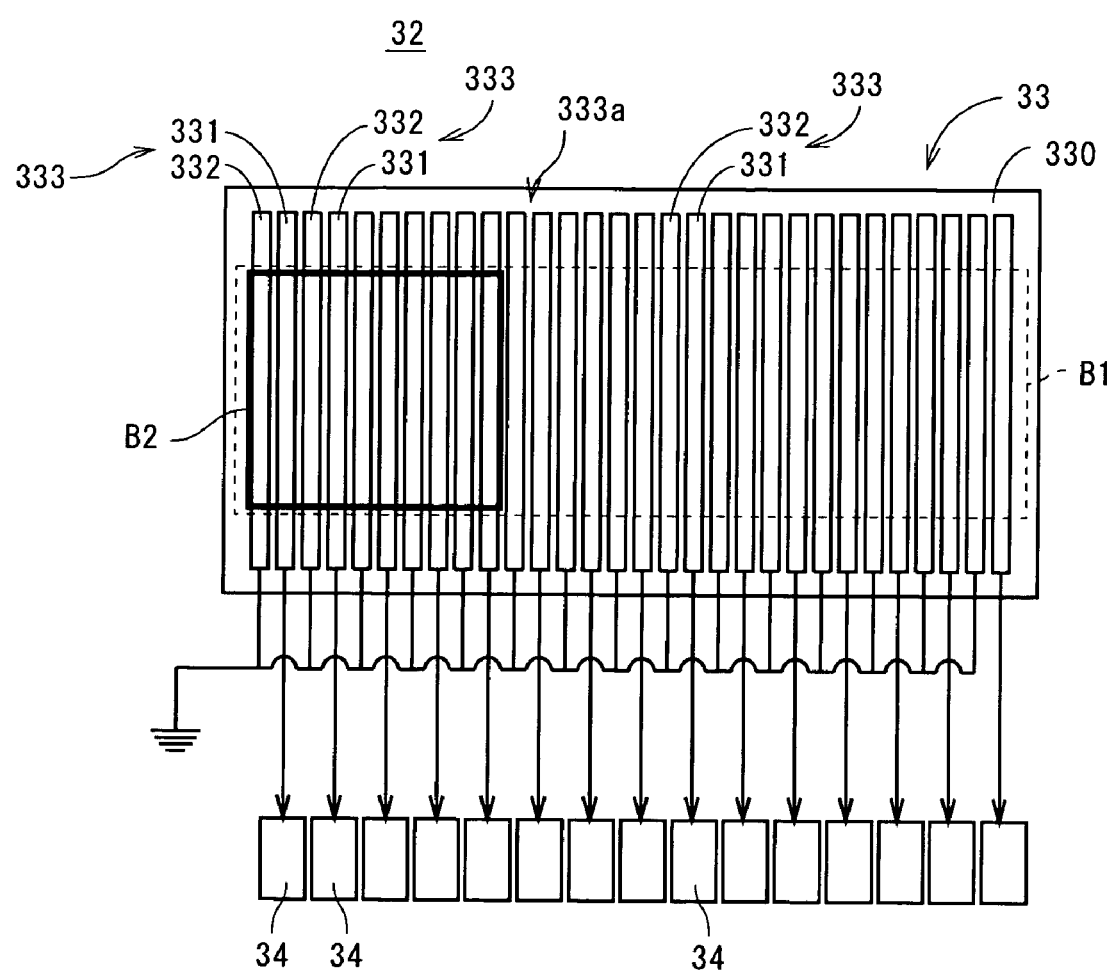
FIG. 3 is a view showing a construction of a light modulation unit.

FIG. 3 is a view showing a construction of the light modulation unit 32. The spatial light modulator 33 in FIG. 3 is a diffraction grating whose grating depth can be changed. Specifically, in the spatial light modulator 33, a plurality of moving ribbons 331 and a plurality of fixed ribbons 332 are alternately arranged in an arrangement direction perpendicular to their longitudinal directions. The moving ribbons 331 can vertically move relatively to a reference plane 330 therebehind and the fixed ribbons 332 are fixed relatively to the reference plane 330. The plurality of moving ribbons 331 are coupled to a plurality of driving circuits 34 (provided in a driving circuit unit 340 of FIG. 2), respectively, which are connected to the writing controller 30 of FIG. 2, and the plurality of moving ribbons 331 are individually controllable by the writing controller 30. In the spatial light modulator 33, a combination of a moving ribbon 331 and an adjacent fixed ribbon 332 (a pair of ribbons) is determined as one grating element 333 and in the whole spatial light modulator 33, a plurality of grating elements 333 each extending in a predetermined direction (an up and down direction of the sheet) and being independently controllable, are arranged in the arrangement direction (a right and left direction of the sheet) perpendicular to the predetermined direction. Further, a combination of a moving ribbon 331 and halves on the moving ribbon 331 sides of two fixed ribbons 332 located on the both sides of the moving ribbon 331 may be regarded as one grating element 333 and also in this case, the grating element 333 substantially has only one set of a moving ribbon 331 and a fixed ribbon 332.

Assuming that in the spatial light modulator 33 the writing controller 30 performs the same control to spatially continuous grating elements 333 (hereinafter, referred to as "grating element group"), when the moving ribbons 331 and the fixed ribbons 332 which are included in the grating element group are positioned at the same height from the reference plane 330 (in other words, the moving ribbons 331 do not deflect and the reflective surfaces of the moving ribbons are at initial positions), a surface of the grating element group becomes an almost continuous plane and a reflected light beam of an incident light is derived as a zeroth order light beam (regular reflection light). On the other hand, when the moving ribbons 331 deflect towards the reference plane 330, the moving ribbons 331 serve as bottom surfaces of grooves of the diffraction grating, and non-zeroth order diffracted light beams (mainly first order diffracted light beams ((+1)st order diffracted light beam and (−1)st order diffracted light beam)) are derived from the grating element group and the zeroth order light beam disappears. As discussed, in the spatial light modulator 33, continuous grating elements 333 (grating element group) can be switched between a state of emitting the zeroth order light beam (hereinafter, the state is referred to as "reflecting state") and a state of emitting the (+/−) first order diffracted light beams (further, high-order diffracted light beams) (hereinafter, the state is referred to as "diffracting state"). The zeroth order light beams (or a beam) emitted from the spatial light modulator 33 with line illumination from the illumination optical system 351 of FIG. 2 are directed onto the photosensitive material 9 through the zoom lens 361 to form spots (or a spot) of light on the photosensitive material 9. The (+/−) first order diffracted light beams are directed to directions different from that of the zoom lens 361. The (+/−) first order diffracted light beams are blocked by a not-shown light blocking part so as not to be stray light.

Here, in the spatial light modulator 33, as the number of grating elements 333 included in a grating element group decreases, in a case where all grating elements 333 included in the grating element group are made to switch between the reflecting state and the diffracting state, a difference in light amounts (i.e., extinction ratio) between the both states, which is applied (per unit time) onto a corresponding area on the photosensitive material, decreases. When the number of grating elements 333 included in the grating element group is 1, the difference is very small. Therefore, actually, the minimum number of continuous grating elements simultaneously forced to the reflecting state or diffracting state is determined as any number which is two or more (hereinafter, the number is referred to as "minimum continuous element number") in each image recording apparatus in accordance with sensitivity of photosensitive material, intensity of light emitted from a light source and the like, so that the difference in light amounts caused by switching between the reflecting state and the diffracting state is sufficient. In the image recording apparatus 1 in this preferred embodiment, the minimum continuous element number is set to 5.

On the spatial light modulator 33 of FIG. 3, if the light from the light source 31 is applied onto an area surrounded by a broken-line rectangle B1 of FIG. 3 and grating elements 333 which are continuing by the minimum continuous element number 5 from the grating element 333 on the left side in FIG. 3 are brought into the reflecting state and the other grating elements 333 are brought into the diffracting state, the zeroth order light beam is emitted only from an area surrounded by a solid-line rectangle B2. Then, a spot of light formed on the photosensitive material 9 is moved in the scan direction at a predetermined speed, a linear area on the photosensitive material 9 (exactly, a part of photosensitive material corresponding to the area) is changed in nature (hereinafter, area changed in nature on the photosensitive material 9 is referred to as "photosensed area"), and a length in the width direction of the photosensed area becomes the minimum line width in the width direction in the image recording apparatus 1. If one grating element (grating element indicated by a reference sign 333a in FIG. 3) adjacent to these five grating elements 333 is additionally brought into the reflecting state, the photosensed area on the photosensitive material 9 spreads in the width direction from the minimum line width by a width corresponding to one grating element 333, that is to say, by a length obtained by dividing the minimum line width by the minimum continuous element number (hereinafter, the width is referred to as "minimum variable width").

As discussed above, in the image recording apparatus 1, with respect to the width direction on the photosensitive material 9 corresponding to the arrangement direction on the spatial light modulator 33, the minimum width of a formed photosensed area becomes the minimum line width, and the width of the photosensed area is changed at the minimum variable width unit, to record an image on the photosensitive material 9. Since the grating element group forced to the reflecting state can be selected from any position, only if the minimum continuous element number of continuous grating elements 333 or more are brought into the reflecting state and the minimum continuous element number of continuous grating elements 333 or more are brought into the diffracting state, a position in the width direction of a photosensed area with a predetermined width on the photosensitive material 9 can be changed at the minimum variable width unit (that is to say, image recording can be performed at addressable resolution of the minimum variable width).

Figure 4:
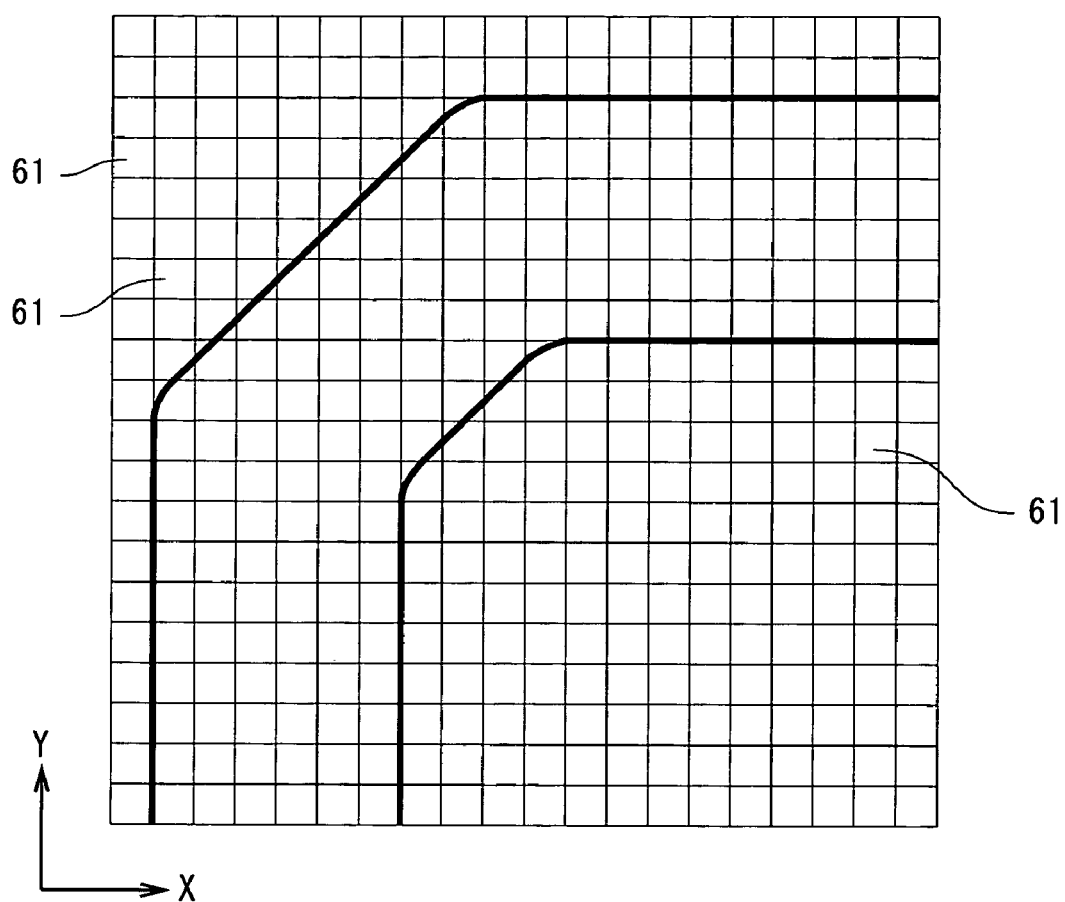
FIG. 4 is a view showing writing cells on a photosensitive material.

FIG. 4 is a view showing writing cells 61 on the photosensitive material 9. The writing cell 61 is a nearly square region fixed on the photosensitive material 9 and corresponds to the smallest unit of writing control. A plurality of writing cells 61 are arranged in the scan direction (Y direction in FIG. 4) and the width direction (X direction in FIG. 4) at the pitch of minimum variable width. In the course of writing, the plurality of grating elements 333 included in the spatial light modulator 33 correspond to the same number of writing cells 61 continuing in the X direction. As discussed later, in the image recording apparatus 1, since an image is recorded on the photosensitive material 9 while continuously moving the head part 3 in the width direction in synchronization with rotation of the holding drum 21, exactly, a side along the main scan direction of the writing cells 61 tilts very slightly relatively to the main scan direction and the writing cells 61 are distorted. In the following description, distortion of the writing cells 61 is neglected. As discussed above, since the minimum line width is the smallest unit in the width direction of the photosensed area on the photosensitive material 9, if the minimum line width is expressed as a pixel width and the minimum variable width is expressed as a sub-pixel width, the pixel width is five times greater than the sub-pixel width.

Next, discussion will be made on an operation flow for recording an image on the photosensitive material 9 in the image recording apparatus 1 with reference to FIG. 5. In the following description, supposing all grating elements 333 included in the spatial light modulator 33 are in the reflecting state, the central part of area on the photosensitive material 9 irradiated with light is called an irradiation position.

Figure 6:
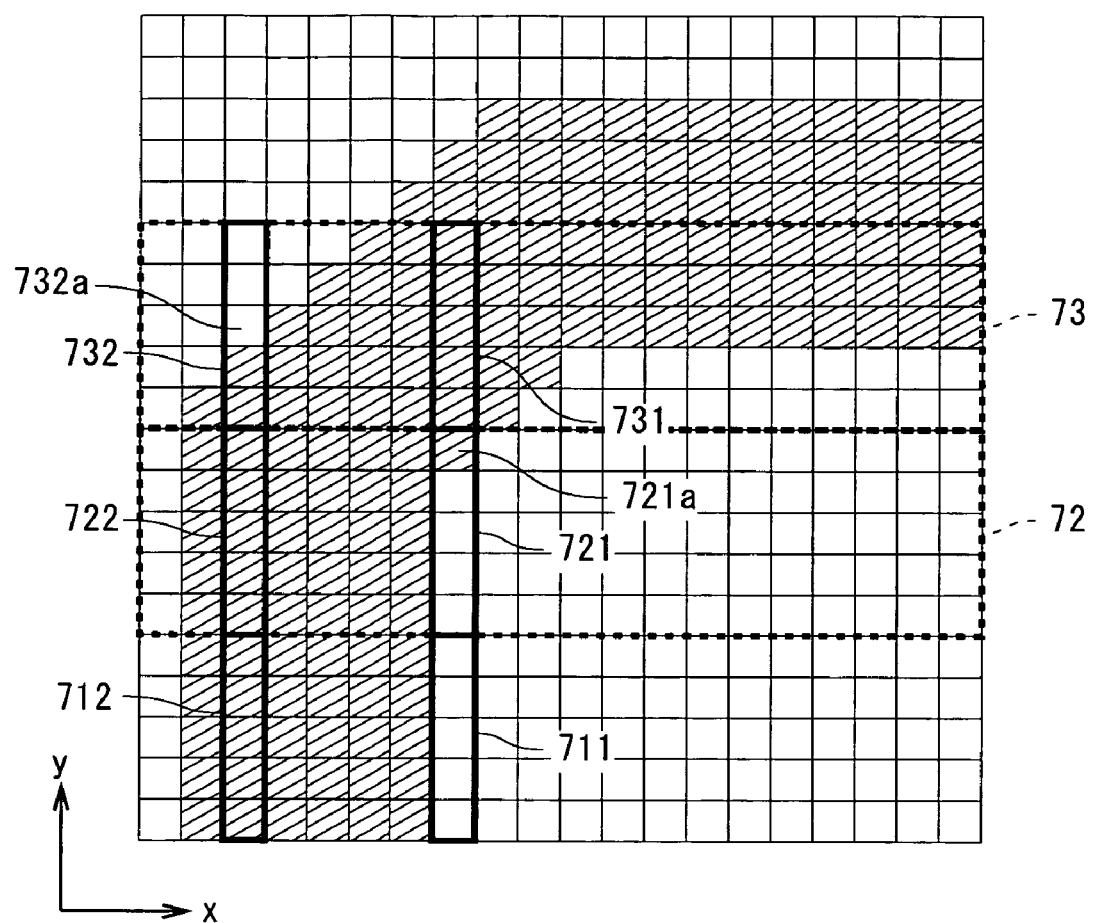
FIG. 6 is a view showing a converted image.

In the image recording apparatus 1, first, data of an original image is inputted to the image signal processing part 51 and converted into an image for the light modulation unit 32 to generate a binary converted image (Step S11). FIG. 6 is a view showing a part of a converted image. In the converted image, a plurality of square binary elements are arranged in the y direction and the x direction of FIG. 6, which are orthogonal to each other. A value of each binary element is, for example, 1 or 0 and the binary elements of value 1 are hatched in FIG. 6.

The y direction and the x direction in FIG. 6 correspond to the scan direction (Y direction in FIG. 4) and the width direction (X direction in FIG. 4) on the photosensitive material 9, respectively, and the plurality of binary elements correspond to the writing cells 61 in FIG. 4. A pitch of the binary elements is corresponding to the minimum variable width (i.e., sub-pixel width). In the converted image, in any position in the y direction, each of binary elements aligning in the x direction is essentially included in any one of groups (or a group) of continuous binary elements each having the value 1 or any one of groups (or a group) of continuous binary elements each having the value 0 each group of which consists of the minimum continuous element number of binary elements or more. Also, in any position in the x direction, each of binary elements aligning in the y direction is essentially included in any one of groups (or a group) of continuous binary elements each having the value 1 or any one of groups (or a group) of continuous binary elements each having the value 0 each group of which consists of the minimum continuous element number of binary elements or more. The values of respective binary elements in the converted image are sequentially outputted to the writing controller 30 as image signals. As discussed later, the binary element of value 1 represents the reflecting state of the grating element 333 and the binary element of value 0 represents the diffracting state.

After generation of the converted image (or in parallel with generation of the converted image), the drum rotation mechanism 22 starts rotating the holding drum 21 at a constant speed and the irradiation position of light from the head part 3 is moved on the photosensitive material 9 in the (+Y) direction (Step S12). Also, the head part 3 starts continuous moving in the width direction at low speed. Subsequently, emission of light from the light source 31 is started (Step S13) and when the irradiation position of light on the photosensitive material 9 reaches a predetermined starting position for writing, writing control is started by the writing controller 30 (Step S14).

As discussed earlier, in the converted image of FIG. 6, in any position in the x direction, groups of the minimum continuous element number 5 of continuous binary elements or more, with respect to the y direction, are made to be values 1 and groups of five continuous binary elements or more are made to be values 0, in each position in the x direction, a position of the binary element for switching the value of image signal is 1 or inexistence (absence) in five binary elements continuing in the y direction (hereinafter, the five binary elements are referred to as "element block"). Therefore, in the writing controller 30, every time when the irradiation position on the photosensitive material 9 is moved by a distance corresponding to one element block (i.e., the distance is the length of five writing cells 61 arranged in the Y direction and equal to the minimum line width), information representing inexistence of switching or a position of switching between the diffracting state and the reflecting state in each grating element 333 which is performed while the irradiation position is moved by a distance of the subsequent minimum line width (hereinafter, the information is referred to as "switching information") is inputted to the driving circuit unit 340 of the spatial light modulator 33, to perform writing control.

Specifically, in the converted image of FIG. 6, paying attention to a plurality of element blocks which are surrounded by a broken-line rectangle 72 and arranged in the x direction (hereinafter, the element blocks are referred to as "target element block group 72"), in the overall controller 50 of FIG. 2, when it is specified on the basis of the signal from the encoder 23 that the irradiation position on the photosensitive material 9 reaches the position of the writing cells 61 corresponding to the binary elements on the (−y) side of the target element block group 72, a timing signal is outputted from the overall controller 50 to the writing controller 30. With this operation, the switching information of each element block included in the target element block group 72 is inputted from the writing controller 30 to the corresponding driving circuit 34.

In the element block surrounded by a solid-line rectangle 721 in FIG. 6 (the element block included in the target element block group 72), since a binary element 721a which is the fifth element from the (−y) side toward the (+y) side is the binary element for switching the value of image signal, the switching information representing necessity of state switching in a corresponding grating element 333 at the time when the irradiation position reaches a position in the Y direction of the writing cell 61 corresponding to the binary element 721a (hereinafter, the position is referred to as "switching position") (actually, the information is only the value "5" representing the fifth binary element) is inputted to the driving circuit 34 of the grating element 333. Immediately after the irradiation position on the photosensitive material 9 reaches the position corresponding to the target element block group 72, the grating element 333 corresponding to the element block 721 keeps a state just after passage of a position corresponding to an element block 711 located on the (−y) side of the element block 721, that is to say, the grating element 333 is in the diffracting state. When the irradiation position on the photosensitive material 9 reaches the switching position, the grating element 333 switches from the diffracting state to the reflecting state and the writing cell 61 corresponding to the binary element 721a is contained in a photosensed area. In the light modulation unit 32, after input of the timing signal, it is possible to specify an arrival time of the irradiation position to the switching position by counting internal clocks and therefore, the switching information can be treated as information representing a time of switching (or inexistence of switching) between the diffracting state and the reflecting state of each grating element 333 which is performed while the irradiation position is moved by a distance of the minimum line width.

In the element block surrounded by a solid-line rectangle 722 in FIG. 6, since the binary element for switching value is inexistent, the switching information representing inexistence of state switching in a corresponding grating element 333 (actually, the information is only the value "0" representing inexistence of switching) is inputted to the driving circuit 34 of the grating element 333 in accordance with the timing signal for the target element block group 72. Immediately after the irradiation position on the photosensitive material 9 reaches the position corresponding for the target element block group 72, the grating element 333 corresponding to the element block 722 keeps a state just after passage of the position corresponding to the element block 712 located on the (−y) side of the element block 722, that is to say, the grating element 333 is in the reflecting state, and the grating element 333 keeps the reflecting state while the irradiation position passes an area on the photosensitive material 9 corresponding to the target element block group 72.

In the writing controller 30, during writing of the target element block group 72 (or before starting time of the writing), the switching information of each element block included in an element block group 73 (hereinafter, referred to as "following element block group 73") located on the (+y) side of the target element block group 72 is obtained.

In a case where a value of the last binary element (positioned at the end on the (+y) side) in a preceding element block (on the (−y) side) is different from a value of the first binary element in a following element block, that is to say, the switching information represents that the writing cell 61 corresponding to the first binary element in the following element block is the switching position, a switching of state in the corresponding grating element 333 is performed at the time when the irradiation position reaches the position corresponding to the following element block.

Subsequently, when the irradiation position on the photosensitive material 9 reaches the position corresponding to the binary elements on the (−y) side of the following element block group 73 (in other words, when the irradiation position is moved by a distance equal to the five writing cells 61 in the scan direction from the position where the previous timing signal is generated), the timing signal is outputted from the overall controller 50 to the writing controller 30 and the switching information of each element block included in the following element block group 73 is inputted from the writing controller 30 to the corresponding driving circuit 34. In the grating element 333 corresponding to an element block 731 located on the (+y) side of the element block 721, the reflecting state is kept on the basis of the switching information representing inexistence of state switching while the irradiation position passes an area on the photosensitive material 9 corresponding to the following element block group 73. In the grating element 333 corresponding to an element block 732 on the (+y) side of the element block 722, on the basis of the switching information representing a switching position corresponding to the third binary element 732a from the (−y) side toward the (+y) side in the element block 732, when the irradiation position on the photosensitive material 9 reaches the switching position, the reflecting state is switched to the diffracting state and the writing cell 61 corresponding to the binary element 732a is not contained in the photosensed area.

With this operation, in the image recording apparatus 1, the timing signal is generated every time when the irradiation position is moved on the photosensitive material 9 by the distance equal to the minimum line width, and the switching information in a time period when the irradiation position is subsequently moved by the distance equal to the minimum line width is inputted to each driving circuit 34. At any time while writing is performed on the photosensitive material 9, (essentially) each of the plurality of grating elements 333 is included in any one of groups (or a group) of continuous grating elements 333 in the diffracting state or any one of groups (or a group) of continuous grating elements 333 in the reflecting state each group of which consists of the minimum continuous element number of the grating elements 333 or more (that is to say, each group of grating elements 333 which are spatially continuously in the diffracting state or spatially continuously in the reflecting state consists of the minimum continuous element number of grating elements 333 or more while writing is performed). In FIG. 4, edges of image written onto a portion on the photosensitive material 9 corresponding to the converted image of FIG. 6 is abstractly shown by thick solid lines. On the photosensitive material 9, in any position in the width direction, continuous writing cells 61 with respect to the scan direction which are contained in the photosensed area are the minimum continuous element number or more and continuous writing cells 61 which are not contained in the photosensed area are also the minimum continuous element number or more. And in any position in the scan direction, continuous writing cells 61 with respect to the width direction which are contained in the photosensed area are the minimum continuous element number or more and continuous writing cells 61 which are not contained in the photosensed area are also the minimum continuous element number or more.

In the image recording apparatus 1, actually, with movement of the head part 3 in the width direction, while the holding drum 21 rotates through approximately 360 degrees, the irradiation position on the photosensitive material 9 is moved in the width direction by a distance equal to distance of the writing cells 61 as many as the number of all grating elements of the spatial light modulator 33 and the irradiation position is continuously moved on the outer peripheral surface of the holding drum 21 almost spirally, to perform writing on the whole photosensitive material 9 (spiral exposure). After writing on the whole photosensitive material 9, emission of light from the light source 31 is stopped and rotation of the holding drum 21 is also stopped (Steps S15, S16), to complete the operation for image recording in the image recording apparatus 1.

Figure 7:
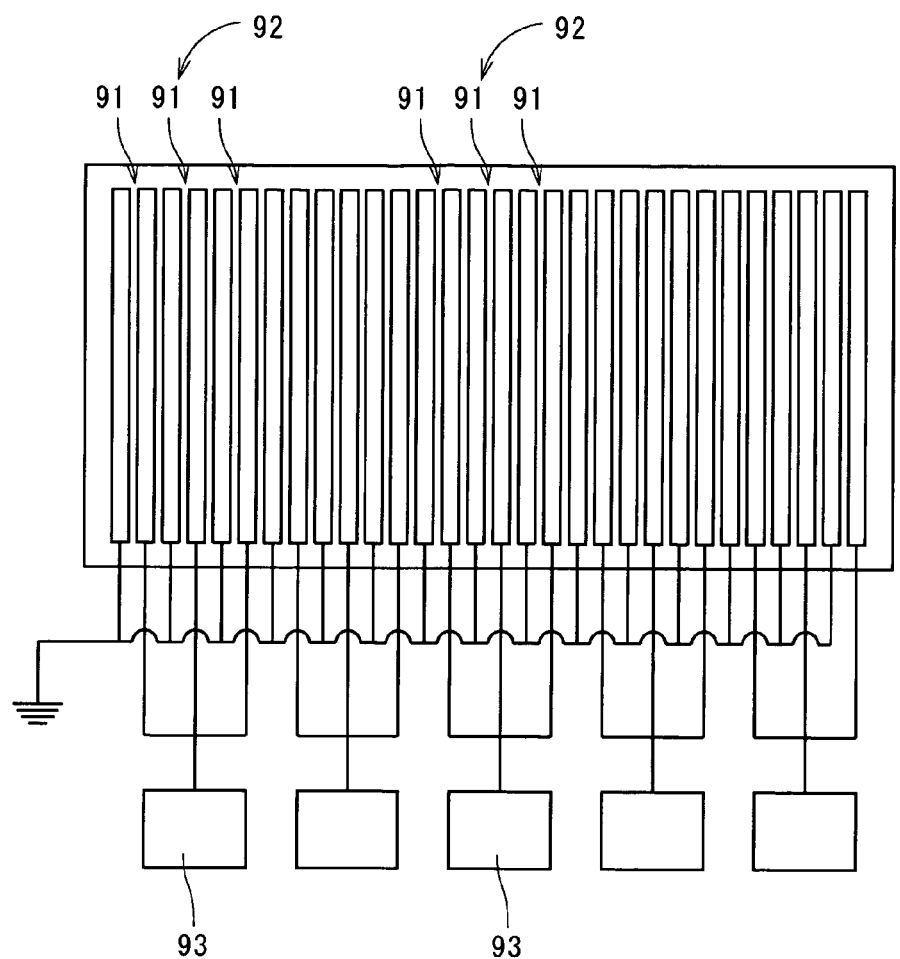
FIG. 7 is a view showing a construction of a light modulation unit in an image recording apparatus of a comparative example.

As shown in FIG. 7, in an image recording apparatus of comparative example where a plurality of ribbon pairs 91 (three ribbon pairs 91 in FIG. 7) are connected to one driving circuit 93 as a ribbon set 92 which is the unit of modulation control (the number of ribbon pairs 91 corresponding to the minimum continuous element number is determined as 3), when an image is recorded on a photosensitive material by simultaneously switching all ribbon pairs 91 included in each ribbon set 92 between the reflecting state and the diffracting state while obtaining a sufficient extinction ratio, normally, writing is performed with an addressable resolution in the width direction which is a distance on the photosensitive material corresponding to width of the minimum continuous element number of ribbon pairs 91. Conversely, in the image recording apparatus 1 of FIG. 1, each of the plurality of grating elements 333 in the spatial light modulator 33 can be independently switched between the reflecting state and the diffracting state, at any time while writing is performed, each grating element 333 is included in the continuous grating elements 333 in the diffracting state or those in the reflecting state which consist of the minimum continuous element number of grating elements 333 or more. This makes it possible to perform writing with an addressable resolution in the width direction which is a distance on the photosensitive material 9 corresponding to width of one grating element 333 in the image recording apparatus 1. Therefore, if image recording is performed at the same addressable resolution with respect to the width direction in both the image recording apparatus 1 of FIG. 1 and the image recording apparatus of comparative example, a projection ratio of the spatial light modulator in the image recording apparatus 1 can be made higher than that in the image recording apparatus of comparative example. As a result, it is possible to easily achieve image recording at high throughput in the image recording apparatus 1 of FIG. 1.

In the image recording apparatus 1, after a switching of state in each grating element 333 is performed and subsequently the irradiation position is moved on the photosensitive material 9 in the scan direction by a distance of the minimum line width or larger which is an integral multiple of the minimum variable width (width of the writing cell 61), the subsequent switching of state is performed. With this operation, it is possible to record an image with the width of minimum line width or more on the photosensitive material 9 at the same addressable resolution corresponding to the width of one grating element 333, with respect to the scan direction and the width direction.

Figure 8:
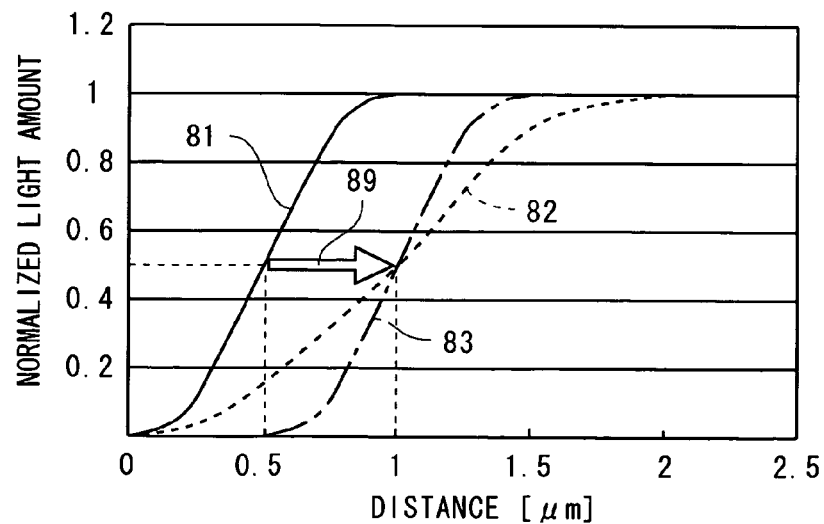
FIG. 8 is a graph showing a distribution of light amount in a width direction of light applied onto the photosensitive material.

FIG. 8 is a graph showing a distribution of light amount in the width direction of light applied from the head part 3 onto a predetermined position in the scan direction on the photosensitive material 9. The vertical axis in FIG. 8 shows a normalized light amount and the horizontal axis shows a distance in the width direction from a predetermined reference point. In FIG. 8, a line 81 represents a distribution of light amount in the vicinity of a boundary (edge) of photosensed area in a direction perpendicular to the boundary, where photosensing of the photosensitive material occurs at 50% in normalized light amount. Therefore, the edge of photosensed area is located at a distance of 0.5 μm from the reference point.

Here, using the method of recording an image at high addressable resolution by changing amount of light applied onto the irradiation regions at specified positions on the photosensitive material (the method disclosed in U.S. Pat. No. 4,879,605 (Document 2) and "Image quality enhancements for raster scan lithography" (Document 3) above discussed), if it is tried to change the position of edge of photosensed area formed on the photosensitive material by a distance of 0.5 μm as indicated by an arrow 89 in FIG. 8, the shape of distribution of light amount is transformed into a line 82 shown in FIG. 8. Specifically, a rate of change of light amount relative to a distance in the width direction in the line 82 is smaller than that in a line 81, and the position of edge of actual photosensed area on the photosensitive material greatly changes in the case that the light amount for photosensing of the photosensitive material slightly varies depending on various conditions for image recording such as environment conditions.

On the other hand, in the image recording apparatus 1, if the position of edge of photosensed area formed on the photosensitive material is changed by a distance of 0.5 μm corresponding to the addressable resolution as indicated by the arrow 89 in FIG. 8, the distribution of light amount is shown with a line 83 in FIG. 8 and the position of edge of photosensed area can be changed without changing the shape of distribution of light amount. This makes it possible to prevent the rate of change of edge position (or line width) of the photosensed area with respect to variation in the light amount for photosensing of the photosensitive material from increasing and, consequently, achieve a stable recording of high accurate image on the photosensitive material 9 at high addressable resolution in the image recording apparatus 1.

Figure 9:
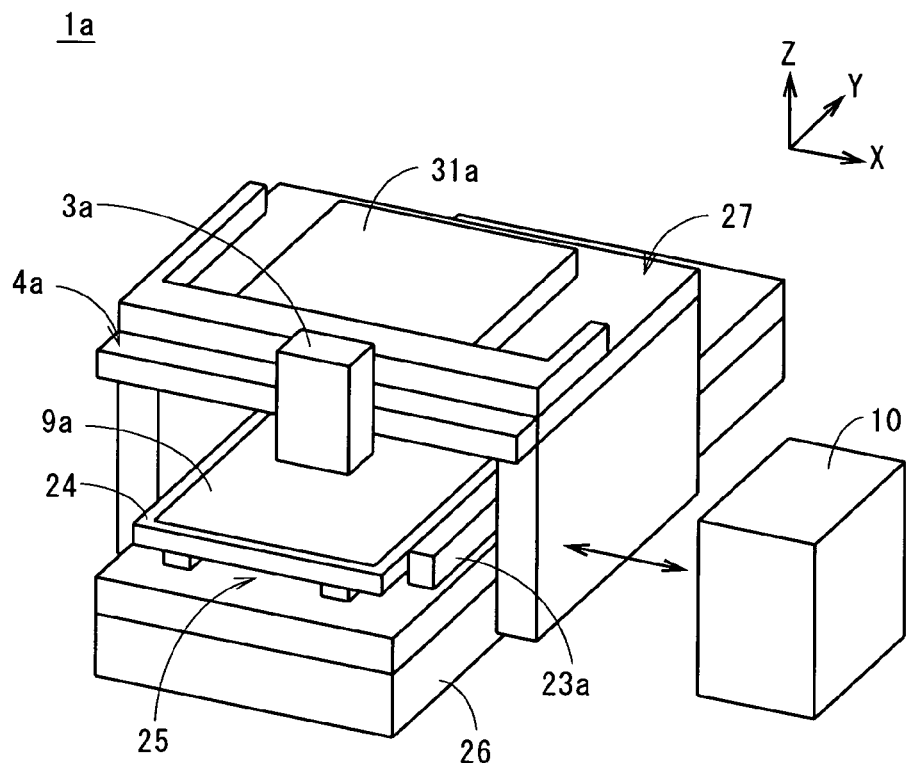
FIG. 9 is a perspective view showing an appearance of an image recording apparatus in accordance with a second preferred embodiment.
Figure 10:
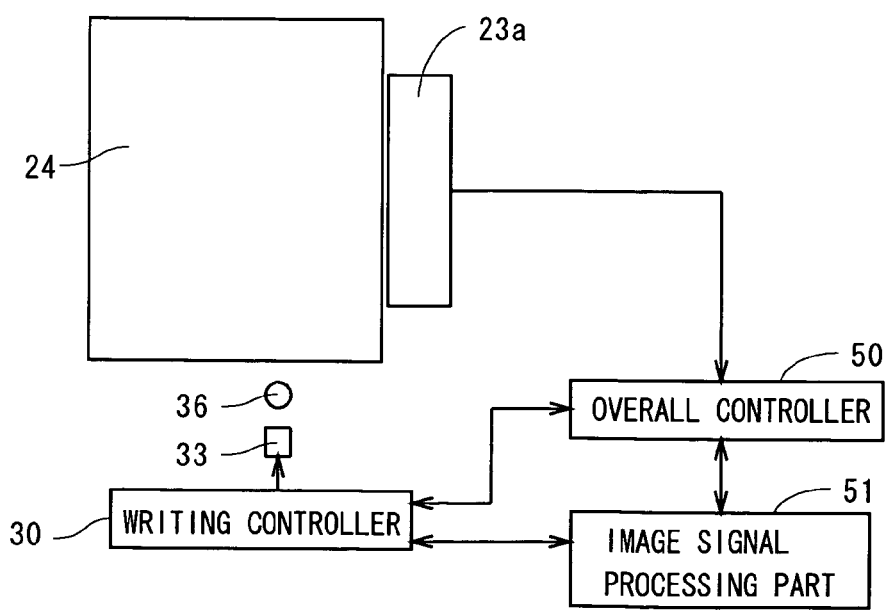
FIG. 10 is a view showing a functional constitution of the image recording apparatus in accordance with the second preferred embodiment.

FIG. 9 is a perspective view showing an appearance of an image recording apparatus 1a in accordance with the second preferred embodiment of the present invention, and FIG. 10 is a view showing a functional constitution of the image recording apparatus 1a. The overall controller 50 and the image signal processing part 51 of FIG. 10 are provided in a control unit 10 of FIG. 9.

The image recording apparatus 1a comprises a table 24 for holding a glass substrate 9a for manufacturing a glass mask, a TFT (Thin Film Transistor) liquid crystal panel or the like on its surface on the (+Z) side in FIG. 9 and on the other side of the table 24, a table moving mechanism 25 for moving the table 24 in the Y direction (scan direction) of FIG. 9 is fixed on a base part 26. A position detecting module 23a for detecting position of the table 24 relative to the base part 26 is provided on the base part 26. A head part 3a for emitting light toward the glass substrate 9a is located above the table 24, and the head part 3a is supported by a head moving mechanism 4a, being movable in the X direction (width direction) of FIG. 9. A frame 27 is attached to the base part 26 over the table 24 and the head moving mechanism 4a is fixed on the frame 27.

In the image recording apparatus 1a of FIG. 9, a light source 31a is positioned on the frame 27 and light from the light source 31a is directed into the head part 3a through optical fibers which are not shown. A photosensitive material (i.e., resist) to be irradiated with ultraviolet rays for photosensing is previously formed on the main surface on the (+Z) side of the glass substrate 9a in this preferred embodiment. The light source 31a is a third harmonic solid-state laser emitting light with a wavelength of 355 nm. The constituent elements of the head part 3a are the same as those of the head part 3 in FIG. 2 except that the light source 31a is positioned outside. In FIG. 10, the projection optical system and the spatial light modulator are abstractly shown by a circle 36 and square 33, respectively.

Figure 5:
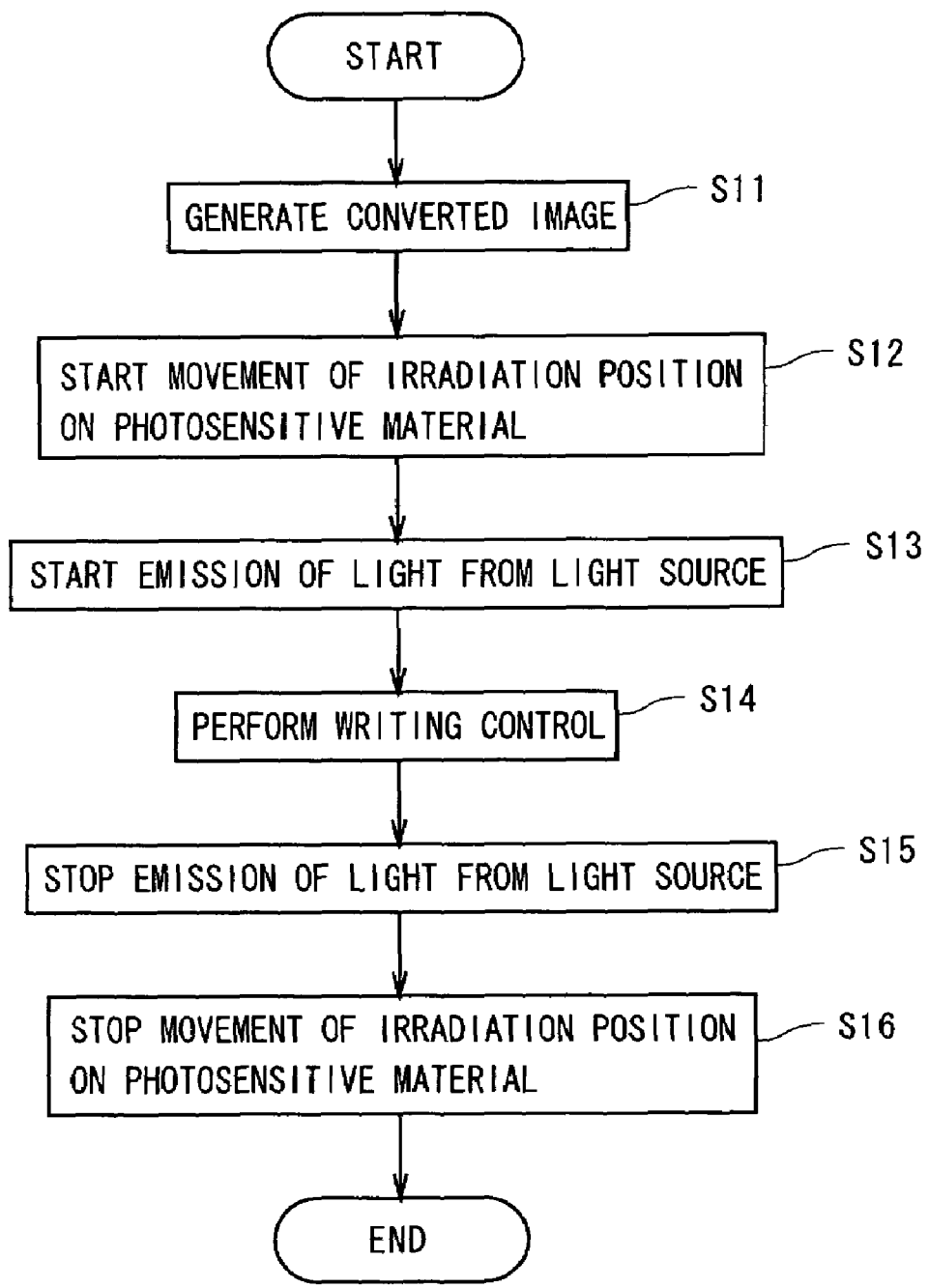
FIG. 5 is a flowchart showing an operation flow for recording an image on the photosensitive material in the image recording apparatus.

An operation for recording an image onto the photosensitive material of the glass substrate 9a in the image recording apparatus 1a is the same as in FIG. 5 except that a transfer path of irradiation position of light on the photosensitive material is different from that in the image recording apparatus 1 of FIG. 1. Specifically, first, by moving the table 24 in the (−Y) direction, the irradiation position on the photosensitive material of light from the head part 3a is continuously moved relatively to the glass substrate 9a in the (+Y) direction. Every time when the irradiation position on the glass substrate 9a is moved by a minimum line width, a timing signal is generated in the overall controller 50 on the basis of a signal from the position detecting module 23a and switching information is inputted from the writing controller 30 to each driving circuit of the spatial light modulator 33. With this operation, each of the plurality of grating elements is included in continuous grating elements in the diffracting state or continuous grating elements in the reflecting state which consist of the minimum continuous element number of grating elements or more, at any time while writing is performed on a strip-like region which extends in the Y direction on the photosensitive material.

When the irradiation position reaches an end of the glass substrate 9a on the (+Y) side, the head part 3a intermittently moves in the width direction by a distance corresponding to a width of the strip-like region in the X direction and the moving direction of the table 24 is reversed. Writing on a backward path of to-and-fro movement is performed on a strip-like region continuous in the X direction with respect to the strip-like region written on a forward path of the table 24. With this operation, in the image recording apparatus 1a, the head part 3a intermittently moves in the X direction while reciprocally moving the table 24 in the Y direction, whereby an image can be appropriately recorded on the whole of the plane photosensitive material at addressable resolution corresponding to the width of the grating element. In the image recording apparatus 1a, it is possible to prevent strip-like regions of the image recorded on the photosensitive material from alternately shifting in the scan direction by slightly shifting (delaying) a generation position of the timing signal between the forward path and the backward path of to-and-fro movement of the table 24 or the like.

From the viewpoint of productivity in manufacture of a liquid crystal panel or the like, a modulation speed in the spatial light modulator 33 (i.e., maximum number of state switching per second in each grating element) for the image recording apparatus 1a is required to be about 200 to 500 Kbps (bit per second). If a light source which is not continuous oscillation type is used in this case, there is a possibility that a light amount applied onto each position (writing cell) on the photosensitive material varies depending on the oscillating frequency of the light source. However, in the image recording apparatus 1a, since used is, for example, the third harmonic solid-state laser with an oscillating frequency of 80 MHz (megahertz), even if the spatial light modulator operates at 1 Mbps which is faster than the above modulation speed, irradiation with pulsed light of 80 times is performed while the irradiation position on the photosensitive material is moved by the distance corresponding to the minimum line width. Thus, even if the number of irradiation times of the pulsed light applied onto each position on the photosensitive material during movement of the irradiation position by the distance corresponding to the minimum line width varies with asynchronous emission timing of the pulsed light from the third harmonic solid-state laser and state switching timing of the grating element in the spatial light modulator, the light amount applied onto the photosensitive material is thought to vary only about 1% and there arises no problem. In the image recording apparatus, a laser capable of oscillating at high frequency (i.e., QCW (Quasi Continuous Wave) laser) also can be used like the continuous oscillation laser and as such a laser, for example, a third harmonic solid-state laser (trade name: the Paladin) of Coherent, Inc. (Sunnyvale, Calif. U.S.A.) has been known. An ultraviolet argon laser emitting light with a wavelength of 364 nm or a blue-violet semiconductor laser emitting light with a wavelength band of 400 to 415 nm may be used as the light source 31a.

Figure 11:
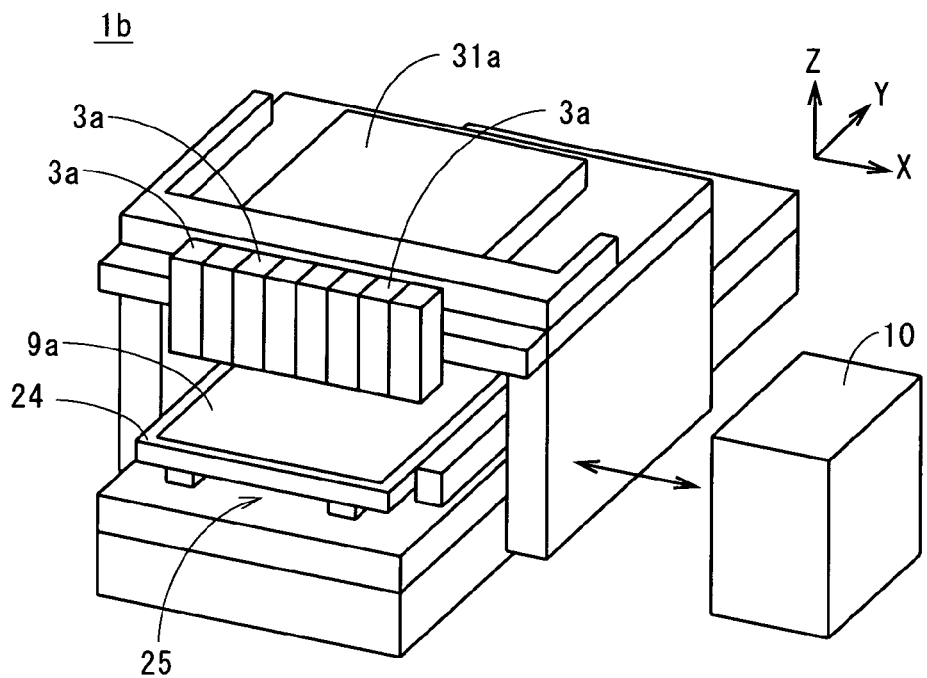
FIG. 11 is a perspective view showing another exemplary image recording apparatus.
Figure 12:
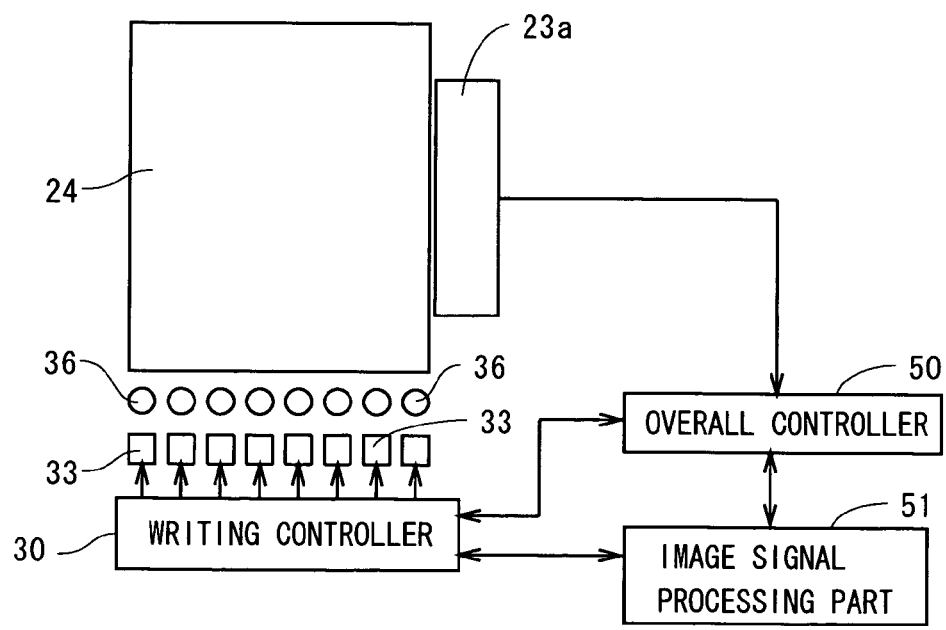
FIG. 12 is a view showing a functional constitution of another exemplary image recording apparatus.

FIG. 11 is a perspective view showing another exemplary image recording apparatus for recording an image onto a photosensitive material on a glass substrate 9a, and FIG. 12 is a view showing a functional constitution of another exemplary image recording apparatus 1b in accordance with another example. In the image recording apparatus 1b, a plurality of head parts 3a arranged in the X direction are located above the glass substrate 9a. Other constituent elements are the same as those of the image recording apparatus 1a in FIGS. 9 and 10, and are represented by the same reference signs in FIGS. 11 and 12.

In the image recording apparatus 1b of FIGS. 11 and 12, on the forward path of to-and-fro movement of the table 24, switching information is inputted from the writing controller 30 to each driving circuit of the spatial light modulator 33 every time when an irradiation position of light from each of the plurality of head parts 3a is moved on a photosensitive material by the minimum line width. On the spatial light modulator 33 in each head part 3a, each of the plurality of grating elements is included in continuous grating elements in the diffracting state or those in the reflecting state which consist of the minimum continuous element number of grating elements or more at any time, to perform writing on a plurality of strip-like regions away from one another in the X direction on the photosensitive material. When the irradiation positions reach an end of the glass substrate 9a, the plurality of head parts 3a intermittently move in the X direction by a distance corresponding to a width of the strip-like region and the moving direction of the table 24 is reversed, whereby writing by each head part 3a is performed on a long region between two adjacent strip-like regions out of the plurality of strip-like regions written on the forward path of the table 24. With this operation, it is possible to perform writing on the whole glass substrate 9a at high speed in the image recording apparatus 1b of FIG. 11.

Though the preferred embodiments of the present invention have been discussed above, the present invention is not limited to the above-discussed preferred embodiments, but allows various variations.

Though the image recording is performed by handling the combination of one moving ribbon 331 and one fixed ribbon 332 as the grating element 333 which is the unit of modulation control in the above first and second preferred embodiments, a combination of a plurality of moving ribbons and a plurality of fixed ribbons which are alternately arranged may be used as the grating element which is the unit of modulation control. In an image recording apparatus including such a plurality of grating elements, even if a sufficient light amount can not be applied onto a photosensitive material at a predetermined scan speed in the case that only one grating element is made to be in the reflecting state and the other grating elements are made to be in the diffracting state, modulation control is performed like the above preferred embodiments, so that, at any time while writing is performed, each of the plurality of grating elements is included in continuous grating elements in the diffracting state or those in the reflecting state which consist of the minimum continuous element number of grating elements or more capable of obtaining a sufficient light amount. This makes it possible to record an image at a line width equal to or greater than a width on the photosensitive material corresponding to width of the minimum continuous element number of grating elements while handling width on the photosensitive material corresponding to width of one grating element as addressable resolution. For effective image recording with the spatial light modulator, it is preferable that a combination of one moving ribbon and one fixed ribbon is one grating element that is the unit of modulation control.

Though the minimum continuous element number is five in the above first and second preferred embodiments, the minimum continuous element number may be 2 in a case where a sufficient amount of light can be applied onto the photosensitive material at a predetermined scan speed. In other words, in the image recording apparatus, it is important that each group of grating elements which are spatially continuously in the diffracting state or spatially continuously in the reflecting state consists of a predetermined number, which is two or more, of grating elements which is capable of applying a sufficient amount of light onto the photosensitive material. In this case, the minimum line width corresponds to a width of the predetermined number of grating elements on the spatial light modulator and the addressable resolution of photosensed area on the photosensitive material is equal to or smaller than half of the minimum line width. In a case where the combination of one moving ribbon 331 and one fixed ribbon 332 is determined as one grating element 333, by setting the minimum continuous element number to 3, in general, it is possible to apply a sufficient amount of light onto a photosensitive material and record an image appropriately.

As far as the moving ribbons 331 and the fixed ribbons 332 can be regarded as strip-like reflective surfaces which extend in a direction perpendicular to the arrangement direction, they do not have to be in a ribbon shape in a strict meaning. For example, upper surfaces of block shapes may serve as the reflective surfaces of fixed ribbons. The spatial light modulator which emits the zeroth order light beams in the state where the moving ribbons deflect may be used, in this case, the relative positional relation between the moving ribbons 331 which are not deflected and the fixed ribbons 332 is different from that in the above preferred embodiments.

Though the zeroth order light beams from the spatial light modulator 33 are directed onto the photosensitive material by the projection optical system 36 in the image recording apparatuses 1, 1a and 1b, depending on the design of the image recording apparatus, the zeroth order light beams from the spatial light modulator 33 are blocked and the (+/−) first order diffracted light beams (plus and/or minus first order diffracted light beams) may be directed onto the photosensitive material. In other words, either zeroth order light beams or (+/−) first order diffracted light beams from the spatial light modulator 33 irradiated with light by the light source are directed onto the photosensitive material by the projection optical system 36, to thereby achieve image recording through the modulation control of the spatial light modulator 33 in the image recording apparatus.

In the image recording apparatuses 1, 1a and 1b, there may be a case where the timing signal is generated every time when the irradiation position on the photosensitive material is moved in the scan direction by a distance corresponding to the minimum variable width (pitch of the writing cell 61) and a signal instructing the reflecting state or diffracting state is inputted to each grating element 333. In order to easily achieve high-speed modulation control by making an output cycle of signal from the writing controller 30 to the driving circuit 34 of the spatial light modulator 33 longer, it is preferable that the switching information representing inexistence of switching or a time of switching between the reflecting state and the diffracting state of each grating element 333 which is performed while the irradiation position on the photosensitive material 9 is moved by a distance equal to the minimum line width is inputted from the writing controller 30 to the driving circuit 34 of the spatial light modulator 33 every time when the irradiation position is moved by a distance of the minimum line width.

In the above second preferred embodiment, there may be a case where a mechanism for moving the head part 3a in the scan direction is provided and the irradiation position of light on the photosensitive material is moved in the scan direction. That is to say, in the image recording apparatus, a scanning mechanism for moving the irradiation position of light on the photosensitive material in the scan direction can be achieved in various manners.

In the image recording apparatuses 1a and 1b for recording an image on a photosensitive material formed on a substrate, an image may be recorded on a photosensitive material formed on a printed circuit board, a semiconductor substrate or the like, as well as a photosensitive material formed on a glass substrate.

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2005-316731 filed in the Japan Patent Office on Oct. 31, 2005, the entire disclosure of which is incorporated herein by reference.

What is claimed is:

1. An apparatus for recording an image on a photosensitive material by irradiation with light, comprising:

a light source emitting light;

a spatial light modulator of diffraction grating type, having a plurality of grating elements each of which is one set of a strip-like fixed reflective surface and a strip-like moving reflective surface extending in a direction perpendicular to a predetermined arrangement direction, said plurality of grating elements being arranged in said arrangement direction;

an optical system for directing either zeroth order light beams or (+/−) first order diffracted light beams from said spatial light modulator irradiated with light by said light source, onto a photosensitive material;

a scanning mechanism for moving an irradiation position on said photosensitive material of light from said spatial light modulator in a scan direction perpendicular to a width direction corresponding to said arrangement direction; and a writing controller for switching each of said plurality of grating elements between a diffracting state and a reflecting state in synchronization with movement of said irradiation position, wherein a minimum line width to be written on said photosensitive material corresponds to a width of a predetermined number of grating elements where said predetermined number is three or more and less than the number of said plurality of grating elements, each group of grating elements which are spatially continuously in said diffracting state or spatially continuously in said reflecting state consists of said predetermined number of grating elements or more while writing is performed, a moving distance in said scan direction of said irradiation position on said photosensitive material between a switching of state in each grating element and a subsequent switching of state is equal to or larger than said minimum line width and said moving distance is variable and an integral multiple of a length obtained by dividing said minimum line width by said predetermined number, and information representing inexistence of switching or a time of switching between said diffracting state and said reflecting state of each grating element which is performed while said irradiation position is moved in said scan direction by a distance equal to said minimum line width is inputted from said writing controller to a driving circuit of said spatial light modulator every time when said irradiation position is moved in said scan direction by a distance of said minimum line width.

2. A method for recording an image on a photosensitive material by irradiation with light, comprising the steps of:

a) irradiating a spatial light modulator of diffraction grating type with light emitted from a light source and directing either zeroth order light beams or (+/−) first order diffracted light beams from said spatial light modulator onto a photosensitive material, said spatial light modulator having a plurality of grating elements each of which is one set of a strip-like fixed reflective surface and a strip-like moving reflective surface extending in a direction perpendicular to a predetermined arrangement direction, said plurality of grating elements being arranged in said arrangement direction;

b) moving an irradiation position on said photosensitive material of light from said spatial light modulator in a scan direction perpendicular to a width direction corresponding to said arrangement direction in parallel with said step a); and c) switching each of said plurality of grating elements between a diffracting state and a reflecting state in synchronization with movement of said irradiation position, wherein a minimum line width to be written on said photosensitive material corresponds to a width of a predetermined number of grating elements where said predetermined number is three or more and less than the number of said plurality of grating elements, each group of grating elements which are spatially continuously in said diffracting state or spatially continuously in said reflecting state consists of said predetermined number of grating elements or more while writing is performed, a moving distance in said scan direction of said irradiation position on said photosensitive material between a switching of state in each grating element and a subsequent switching of state is equal to or larger than said minimum line width and said moving distance is variable and an integral multiple of a length obtained by dividing said minimum line width by said predetermined number, and information representing inexistence of switching or a time of switching between said diffracting state and said reflecting state of each grating element which is performed while said irradiation position is moved in said scan direction by a distance equal to said minimum line width is inputted to a driving circuit of said spatial light modulator every time when said irradiation position is moved in said scan direction by a distance of said minimum line width.

* * * * *